United States Patent
Doumae et al.

(10) Patent No.: US 12,332,281 B2
(45) Date of Patent: Jun. 17, 2025

(54) VOLTAGE DETECTION PROBE AND ELECTRODE MOUNTING TOOL

(71) Applicant: DAIKIN INDUSTRIES, LTD., Osaka (JP)

(72) Inventors: Hiroshi Doumae, Osaka (JP); Yuka Miyake, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 157 days.

(21) Appl. No.: 18/129,686

(22) Filed: Mar. 31, 2023

(65) Prior Publication Data

US 2023/0236226 A1  Jul. 27, 2023

Related U.S. Application Data

(63) Continuation of application No. PCT/JP2021/036765, filed on Oct. 5, 2021.

(30) Foreign Application Priority Data

Oct. 8, 2020  (JP) .................. 2020-170349

(51) Int. Cl.
*G01R 15/16* (2006.01)
*G01R 19/00* (2006.01)

(52) U.S. Cl.
CPC ......... *G01R 15/16* (2013.01); *G01R 19/0084* (2013.01)

(58) Field of Classification Search
CPC ............................ G01R 15/16; G01R 19/0084
USPC .......................... 324/126, 117 H, 117 R, 72.5
See application file for complete search history.

(56) References Cited

U.S. PATENT DOCUMENTS

| | | | | |
|---|---|---|---|---|
| 5,690,643 | A | * | 11/1997 | Wijay ........................ A61F 2/95 606/198 |
| 2013/0076343 | A1 | * | 3/2013 | Carpenter ................ G01R 1/22 324/252 |
| 2014/0354302 | A1 | * | 12/2014 | Lu .......................... G01R 15/16 324/658 |

FOREIGN PATENT DOCUMENTS

| | | |
|---|---|---|
| EP | 3 118 632 A1 | 1/2017 |
| JP | 10-206466 A | 8/1998 |
| JP | 2001-4672 A | 1/2001 |
| JP | 2010-236984 A | 10/2010 |
| JP | 2012-163394 A | 8/2012 |
| JP | 2014-182060 A | 9/2014 |

OTHER PUBLICATIONS

European Search Report of corresponding EP Application No. 21 87 7601.1 dated Feb. 2, 2024.

(Continued)

*Primary Examiner* — Vincent Q Nguyen
(74) *Attorney, Agent, or Firm* — GLOBAL IP COUNSELORS, LLP (57) ABSTRACT

A voltage detection probe includes an electrode configured to detect a voltage applied to a wire, and a clip portion freely attachable to and detachable from the wire. The clip portion has a fitting concave portion into which the wire is to be fitted, the clip portion being elastically deformable to widen an opening of the fitting concave portion. The clip portion is configured to retain, by an elastic force, the wire fitted through the opening into the fitting concave portion to cause the electrode to be disposed along an outer peripheral surface of the wire.

15 Claims, 12 Drawing Sheets

(56) References Cited

OTHER PUBLICATIONS

International Search Report of corresponding PCT Application No. PCT/JP2021/036765 dated Dec. 14, 2021.
International Preliminary Report of corresponding PCT Application No. PCT/JP2021/036765 dated Apr. 20, 2023.

* cited by examiner

VOLTAGE DETECTION PROBE AND ELECTRODE MOUNTING TOOL

CROSS-REFERENCE TO RELATED APPLICATIONS

This is a continuation of International Application No. PCT/JP2021/036765 filed on Oct. 5, 2021, which claims priority to Japanese Patent Application No. 2020-170349, filed on Oct. 8, 2020. The entire disclosures of these applications are incorporated by reference herein.

BACKGROUND

Technical Field

The present disclosure relates to a voltage detection probe and an electrode mounting tool.

Background Art

A non-contact voltage measuring device has been known which can measure the alternating-current (AC) voltage applied to a wire that includes a core wire coated with an insulator, without breaking the insulator. A voltage measuring device of this type is disclosed, for example, in Japanese Unexamined Patent Publication No. H10-206466. The voltage measuring device disclosed in Japanese Unexamined Patent Publication No. H10-206466 includes a voltage detection probe that includes a hook-shaped electrode having a "U" shape and coated with an insulating cover.

SUMMARY

A first aspect of the present disclosure is directed to a voltage detection probe. The voltage detection probe includes an electrode configured to detect a voltage applied to a wire, and a clip portion freely attachable to and detachable from the wire. The clip portion has a fitting concave portion into which the wire is to be fitted, the clip portion being elastically deformable to widen an opening of the fitting concave portion. The clip portion is configured to retain, by an elastic force, the wire fitted through the opening into the fitting concave portion to cause the electrode to be disposed along an outer peripheral surface of the wire.

DETAILED DESCRIPTION OF EMBODIMENT(S)

First Embodiment

A first embodiment will be described. In the first embodiment, a voltage detection probe according to the technique of the present disclosure will be described.

Usage Example of Voltage Detection Probe

Figure 1:
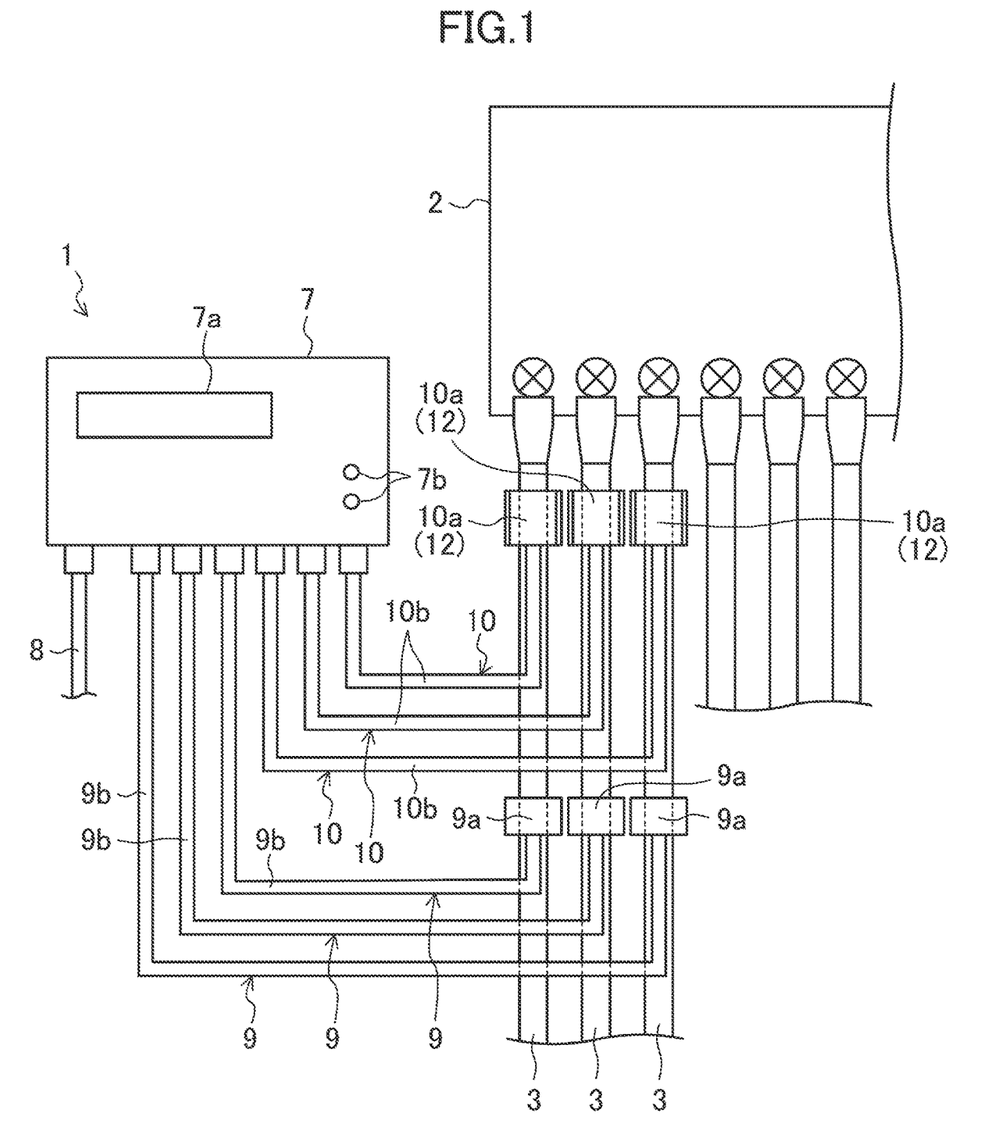
FIG. 1 is a schematic diagram exemplifying a usage state of a power measuring device according to a first embodiment.

Voltage detection probes (10) according to the first embodiment are used for a power measuring device (1) as illustrated in FIG. 1. The power measuring device (1) is a device that measures the power consumed in a demand area, such as an office, a factory, or a home. The power measuring device (1) is used with its various probes (9, 10) attached to associated wires (3) of an electric installation (2), such as a distribution board.

The power measuring device (1) includes one measuring instrument (7), a plurality of (three in the illustrated example) current detection probes (9), and a plurality of (three in the illustrated example) voltage detection probes (10).

The current detection probes (9) each include a current sensor (9a) and a signal cable (9b). The current sensor (9a) detects the current flowing through a core wire (4) of the wire (3). The current sensor (9a) is freely attachable to and detachable from the wire (3). Examples of the current sensor (9a) include a current transformer (CT) sensor. The signal cable (9b) connects the current sensor (9a) to the measuring instrument (7). The signal cable (9b) feeds a current signal corresponding to a current value detected by the current sensor (9a) to the measuring instrument (7).

The voltage detection probes (10) each include a voltage sensor (10a) and a signal cable (10b). The voltage sensor (10a) detects the voltage applied to the core wire (4) of the wire (3). The voltage sensor (10a) detects a voltage change based on the capacitance formed between the core wire (4) of the wire (3) and an electrode (28) by capacitive coupling. The voltage sensor (10a) is freely attachable to and detachable from the wire (3). The signal cable (10b) connects the voltage sensor (10a) to the measuring instrument (7). The signal cable (10b) feeds a voltage signal corresponding to a voltage value detected by the voltage sensor (10a) to the measuring instrument (7).

The measuring instrument (7) measures the power consumed through the wires (3) to which the current detection probes (9) and the voltage detection probes (10) are mounted, based on the current signals from the current detection probes (9) and the voltage signals from the voltage detection probes (10). The measuring instrument (7) includes a display (7a) indicating information about the measurement result and lamps (7b) indicating the state of operation. The measuring instrument (7) is connected to an external power source through a power cable (8), and operates on the power received from the power cable (8).

Configuration of Voltage Detection Probe

Figure 2:
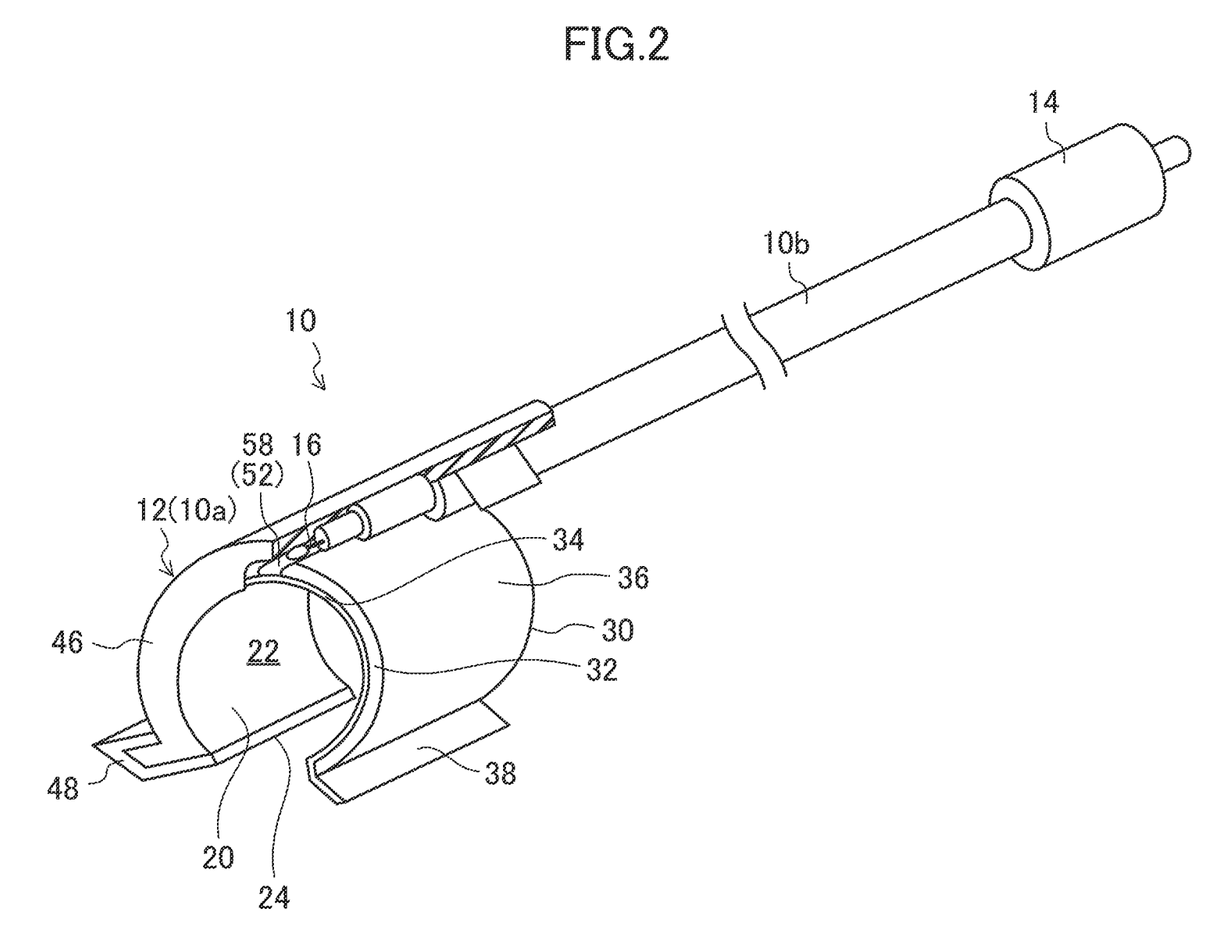
FIG. 2 is a perspective view exemplifying a configuration of a voltage detection probe according to the first embodiment.

The voltage detection probe (10) is intended for the wire (3) (so-called insulated wire, see FIG. 3) including the core wire (4) coated with an insulator (5). As illustrated in FIG. 2, the voltage detection probe (10) includes a clip portion (12) that is freely attachable to and detachable from the wire (3). In FIG. 2, a half of an insulating coating (46) is omitted for convenience. The clip portion (12) constitutes the voltage sensor (10a). The clip portion (12) is provided at one end portion of the signal cable (10b). The other end portion of the signal cable (10b) is provided with a connector (14) for connection with the measuring instrument (7).

The signal cable (10b) is configured as a flexible coaxial cable. The signal cable (10b) includes an inner conductor. The inner conductor is coated with an insulator, an outer conductor, and a sheath. The inner conductor includes a signal wire (16) serving as a distributing wire and a shielding wire (18) (see FIG. 4). The signal wire (16) is electrically connected to the electrode (28) of the clip portion (12) (voltage sensor (10a)). The shielding wire (18) is electrically connected to a shield body (40) and a spring member (30) of the clip portion (12).

Clip Portion

Figure 3:
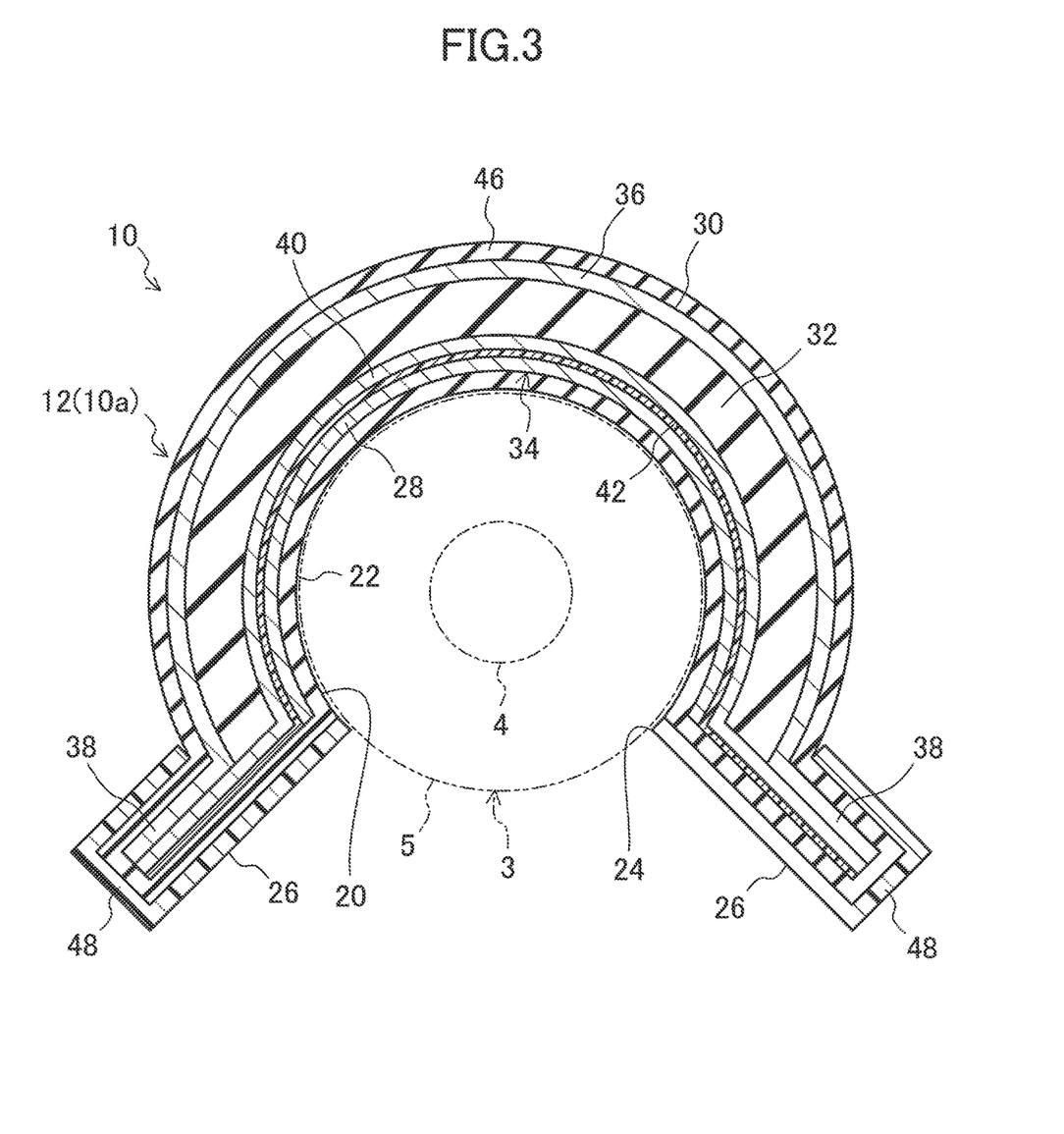
FIG. 3 is a cross-sectional view exemplifying the voltage detection probe according to the first embodiment.

As illustrated in FIG. 3, the clip portion (12) has a fitting concave portion (20) into which the wire (3) is fitted. The fitting concave portion (20) has an inner surface (22) having the shape of an arc with an arc length greater than that of a corresponding semicircle. An opening (24) of the fitting concave portion (20) constitutes a fitting port through which the wire (3) is to be fitted into the fitting concave portion (20). The clip portion (12) is provided with a pair of guide pieces (26) for guiding the wire (3) that is to be fitted into the fitting concave portion (20) to the opening (24). The pair of guide pieces (26) extend obliquely outward, toward the front side of the opening (24) and away from each other, from a pair of peripheral edges of the opening (24) of the fitting concave portion (20) opposed to each other.

The clip portion (12) includes an electrode (28) for detecting the voltage applied to the wire (3) (strictly, the core wire (4)). The clip portion (12) is elastically deformable to widen the opening (24) of the fitting concave portion (20). Specifically, the clip portion (12) includes the spring member (30) having an arc shape, a cushion material (32) provided on the inner side of the spring member (30) and between the spring member (30) and the electrode (28), and a sensor sheet (34) including the electrode (28).

The spring member (30) is a member that imparts elastic deformability to the clip portion (12). The spring member (30) includes a curved portion (36) curved in the shape of an arc, and a pair of extension pieces (38) extending obliquely outward from both lateral ends of the curved portion (36). The curved portion (36) has the shape of an arc with an arc length greater than that of a corresponding semicircle. The pair of extension pieces (38) extend away from each other toward the front side of the opening (24). The pair of extension pieces (38) form the guide pieces (26) of the clip portion (12). The spring member (30) is made of an elastically deformable material. The spring member (30) of this example is made of phosphor bronze. The spring member (30) also functions as a shield for shielding electromagnetic waves.

The cushion material (32) is a member having both flexibility and elasticity. The cushion material (32) is provided on the inner side of the curved portion (36) of the spring member (30) and is curved in the shape of an arc. The cushion material (32) adheres to the inner surface of the curved portion (36). The cushion material (32) is made of a resin with electrical insulating properties. Examples of the material of the cushion material (32) include a fluororesin or a silicon resin.

The sensor sheet (34) is intended to detect the voltage applied to the wire (3) fitted into the fitting concave portion (20). The sensor sheet (34) is provided on the inner side of the cushion material (32) and is curved in the shape of an arc. The sensor sheet (34) includes the shield body (40) in the shape of a film, an insulating film (42) provided on one side of the shield body (40), and the electrode (28) opposite the shield body (40) with the insulating film (42) interposed therebetween. Both the shield body (40) and the insulating film (42) are provided in an area corresponding to the inner surface of the curved portion (36) of the spring member (30) and the surfaces of the extension pieces (38) facing the opening (24).

The shield body (40) is formed of a conductive metal material. The shield body (40) forms part of the sensor sheet (34) located near the cushion material (32). The insulating film (42) electrically insulates the shield body (40) and the electrode (28) from each other. The insulating film (42) is made of a resin with electrical insulating properties. The insulating film (42) is provided on one entire surface of the shield body (40) facing the fitting concave portion (20).

The electrode (28) is made of a conductive metal material. The electrode (28) forms part of the sensor sheet (34) located near the fitting concave portion (20). The lateral length of the electrode (28) is less than that of the shield body (40). The electrode (28) is disposed only on the inner side of the curved portion (36) of the spring member (30), i.e., only on the inner side of the cushion material (32). The electrode (28) has an arc shape curved and extending along the inner surface (22) of the fitting concave portion (20).

An assembly consisting of the spring member (30), the cushion material (32), and the sensor sheet (34) is coated with the insulating coating (46). The insulating coating (46) is made of a material with electrical insulating properties. Examples of the material of the insulating coating (46) include styrene-butadiene rubber (SBR). The insulating coating (46) coats the outer surface of the spring member (30). The insulating coating (46) further coats the electrode (28) of the sensor sheet (34) and constitutes the inner surface (22) of the fitting concave portion (20). Each of the extension pieces (38) of the spring member (30), and the shield body (40) and the insulating film (42) provided at the extension piece (38), are coated with the insulating coating (46) to form the guide piece (26).

Each of the guide pieces (26) is provided with a low friction sheet (48) covering a lamination of the extension piece (38) of the spring member (30), the shield body (40) and the insulating film (42), and the insulating coating (46). The low friction sheet (48) is made of a material having a coefficient of friction that is lower than that of the insulating coating (46). Examples of the material of the low friction sheet (48) include a fluororesin. The provision of the low friction sheet (48) makes the coefficient of friction of the surface of the guide piece (26) facing the opening (24) lower than the coefficient of friction of the inner surface (22) of the fitting concave portion (20) made of the insulating coating (46).

Figure 4:
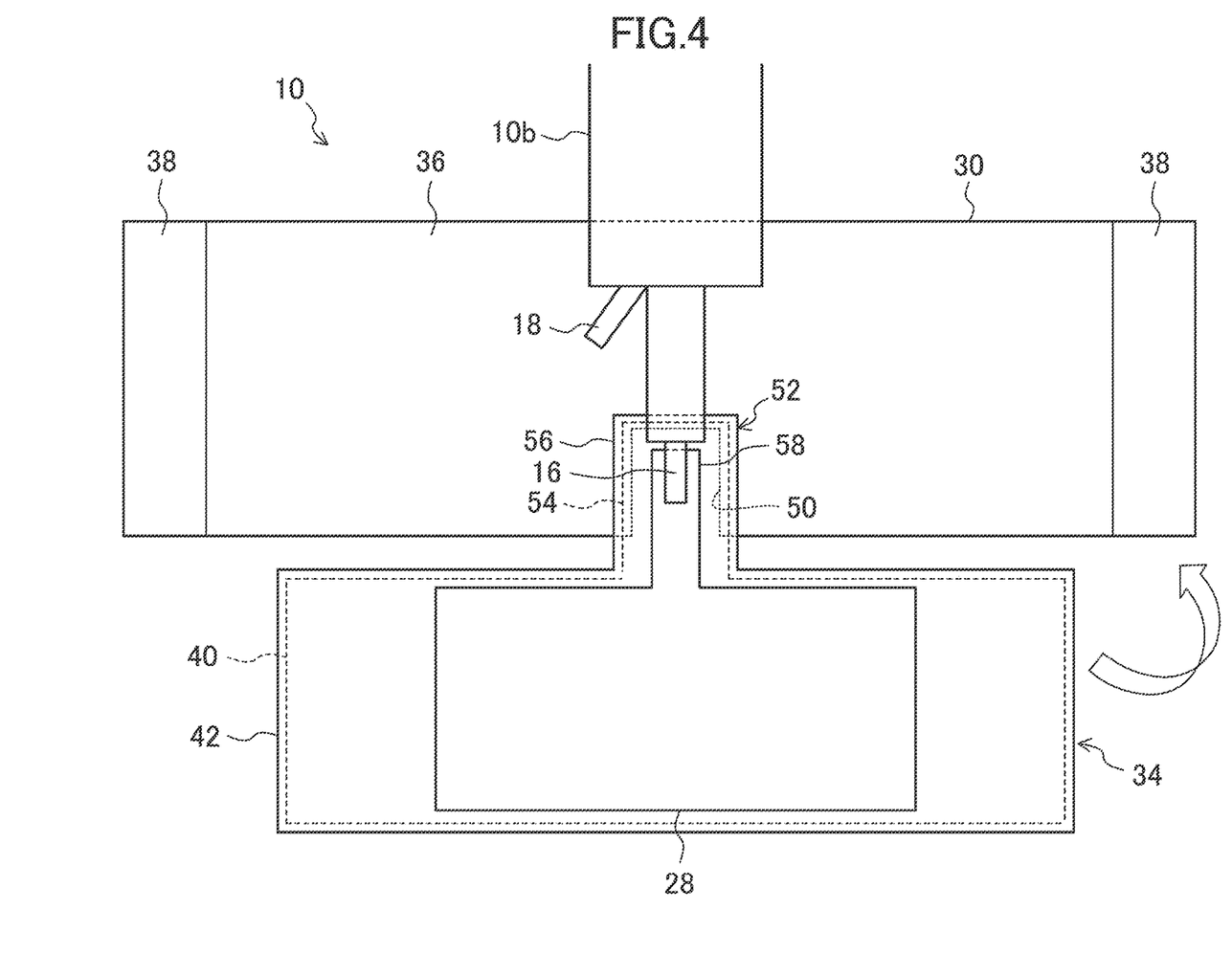
FIG. 4 is a development view for explaining an essential portion of the voltage detection probe according to the first embodiment.

FIG. 4 is a development view of the spring member (30) and the sensor sheet (34) included in the voltage detection probe (10) and also shows the signal cable (10b). As illustrated in FIG. 4, a central portion of the curved portion (36) of the spring member (30) corresponding to the bottom of the fitting concave portion (20) has a notch (50) that opens forward. The sensor sheet (34) has a folded portion (52) to be folded across the end of the spring member (30) on the open end side of the notch (50) from the inner side to the outer side of the spring member (30). The folded portion (52) includes a protruding piece (54) protruding from the shield body (40), a protruding piece (56) protruding from the insulating film (42), and a protruding piece (58) protruding from the electrode (28).

The protruding piece (54) of the shield body (40) is in contact with the outer surface of the curved portion (36) of the spring member (30) at the periphery of the notch (50). The protruding piece (56) of the insulating film (42) covers the protruding piece (54) of the shield body (40). The protruding piece (58) of the electrode (28) is folded toward the outer side of the curved portion (36) across the end of the spring member (30) together with the protruding pieces (54, 56) of the shield body (40) and the insulating film (42). The signal wire (16) and the shielding wire (18) extend out of the distal end of the signal cable (10b) on the outer side of the curved portion (36) of the spring member (30).

The signal wire (16) is connected, by soldering, to the protruding piece (58) of the electrode (28) on the outer side of the curved portion (36) of the spring member (30). On the other hand, the shielding wire (18) is connected, by soldering, to the outer surface of the curved portion (36) of the spring member (30). In manufacturing the voltage detection probe (10), the signal wire (16) is soldered to the protruding piece (58) of the electrode (28) in the state illustrated in FIG. 4, and thereafter the sensor sheet (34) is folded toward the inner side of the spring member (30), thereby disposing the sensor sheet (34) on the inner side of the spring member (30).

Figure 5:
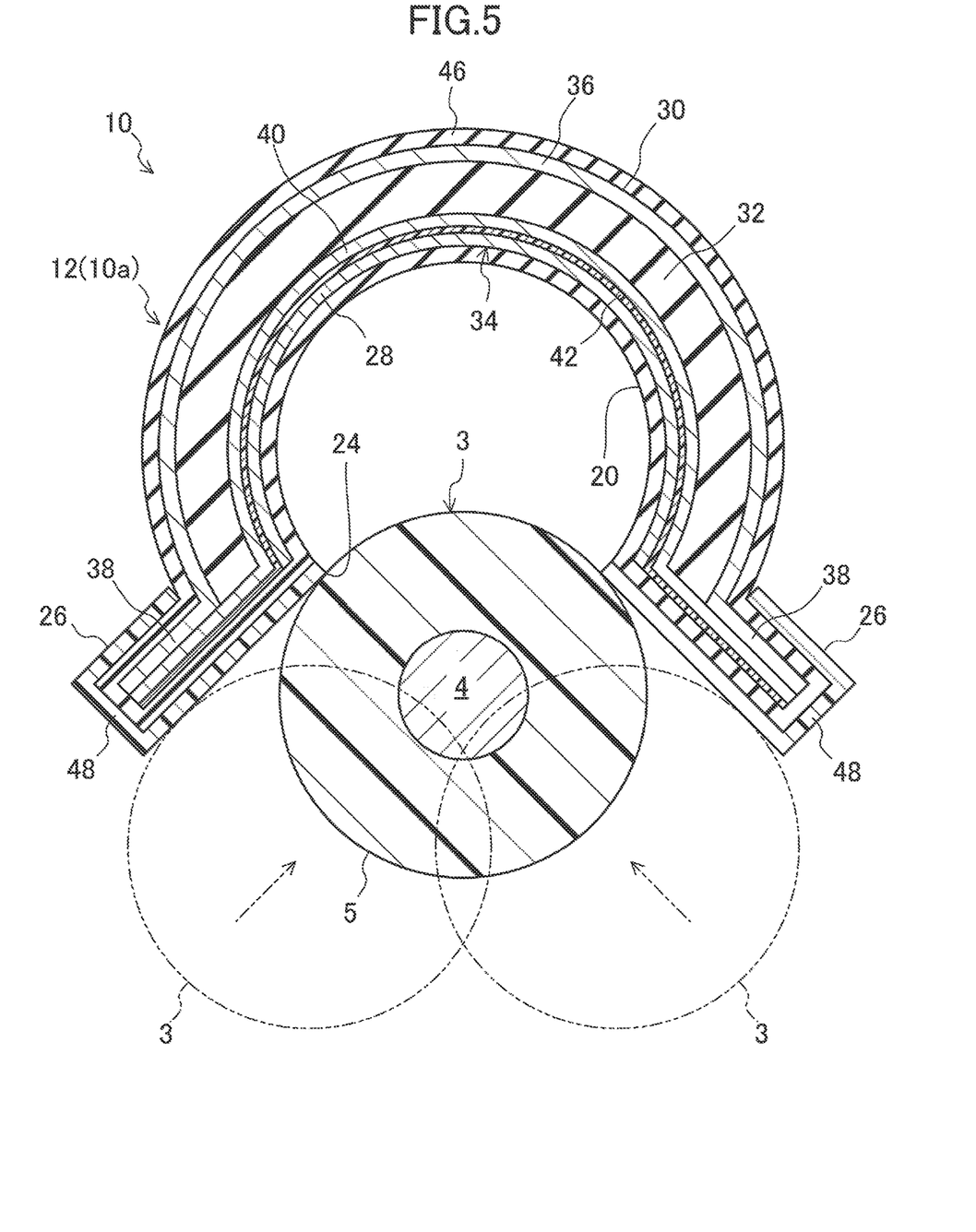
FIG. 5 is a cross-sectional view illustrating how the voltage detection probe according to the first embodiment is attached to a wire.
Figure 6:
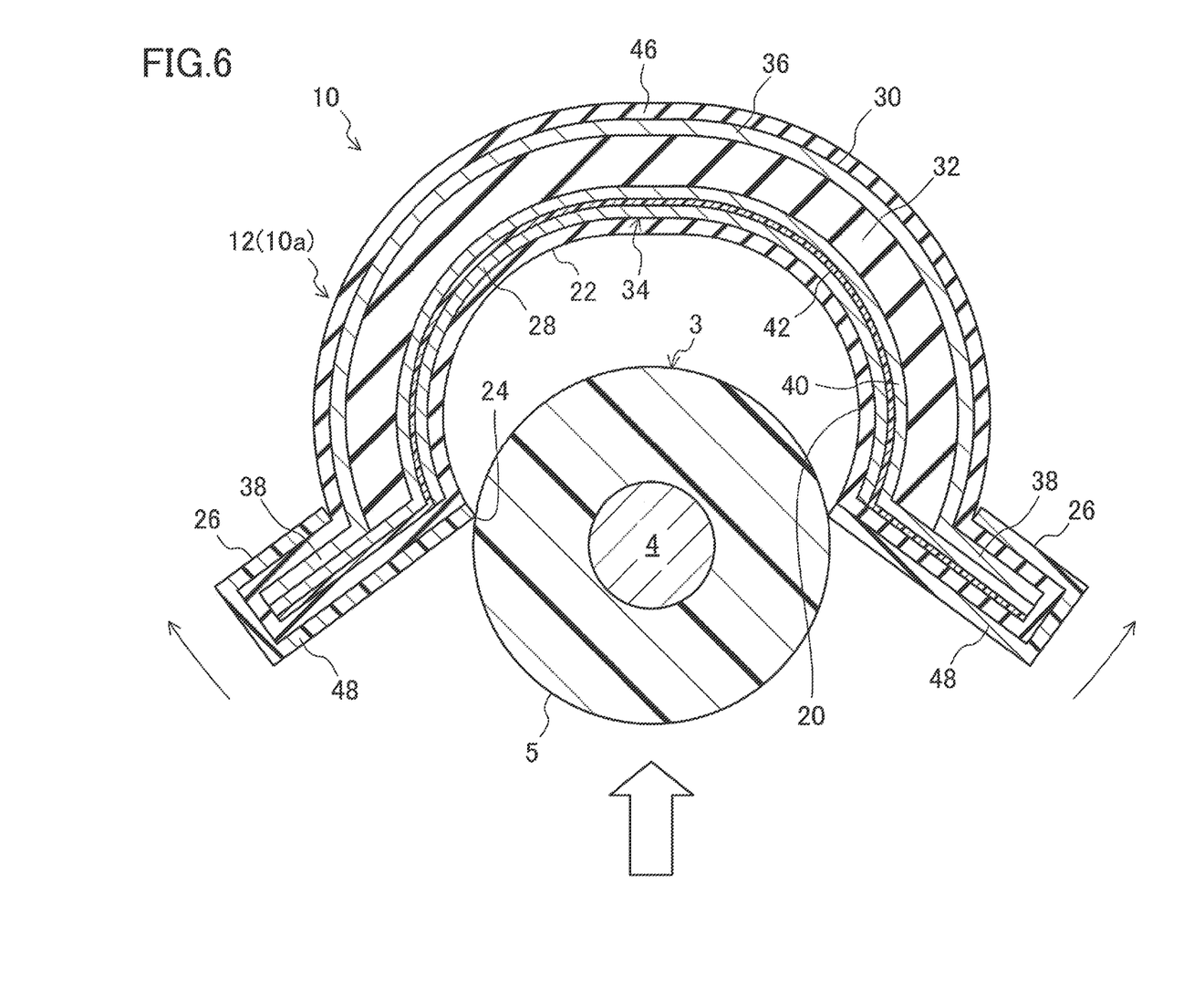
FIG. 6 is a cross-sectional view illustrating how the voltage detection probe according to the first embodiment is attached to a wire.

The voltage detection probe (10) configured as described above is attachable to the wire (3) by simply pressing the opening (24) of the clip portion (12) against the wire (3). As illustrated in FIG. 5, in attaching the voltage detection probe (10) to the wire (3), the guide pieces (26) of the clip portion (12) allow the wire (3) to slide on the low friction sheet (48) and to be guided to the opening (24). Then, as illustrated in FIG. 6, the clip portion (12) is deformed by the pressing force against the wire (3), which widens the opening (24) of the fitting concave portion (20) and allows the wire (3) to be fitted into the fitting concave portion (20).

Once the wire (3) is fitted into the fitting concave portion (20), the clip portion (12) is elastically recovered, and the opening (24) of the fitting concave portion (20) becomes narrow. Accordingly, the clip portion (12) retains, by an elastic force, the wire (3) fitted into the fitting concave portion (20), causing the electrode (28) to be placed along the outer peripheral surface of the wire (3) (insulator (5)). When the pair of guide pieces (26) are pulled in directions away from each other, the clip portion (12) is deformed, and the opening (24) of the fitting concave portion (20) widens. The wire (3) is detachable from the fitting concave portion (20) by such a deformation of the clip portion (12) of the voltage detection probe (10).

Features of First Embodiment

The voltage detection probe (10) of the first embodiment includes the clip portion (12) that is freely attachable to and detachable from the wire (3) The clip portion (12) is elastically deformable to widen the opening (24) of the fitting concave portion (20). The wire (3) is fitted into the fitting concave portion (20) of the clip portion (12) through the widened opening (24). The clip portion (12) retains, by an elastic force, the wire (3) fitted into the fitting concave portion (20), thereby causing the electrode (28) to be placed along the outer peripheral surface of the wire (3). Thus, the voltage detection probe (10) allows the electrode (28) to be easily fixed to the wire (3) in a compact configuration.

In the voltage detection probe (10) according to the first embodiment, the inner surface (22) of the fitting concave portion (20) has an arc shape. Thus, when the clip portion (12) is mounted to the wire (3), the inner surface (22) of the fitting concave portion (20) is along the outer peripheral surface of the wire (3). This can reduce the influence of the clip portion (12) mounted to the wire (3) on the electrical characteristics between the electrode (28) and the wire (3). This helps improve the accuracy of detection of the voltage applied to the wire (3).

In the voltage detection probe (10) of the first embodiment, the clip portion (12) includes the cushion material (32) provided on the inner side of the spring member (30) and between the spring member (30) and the electrode (28) inside the spring member (30). The cushion material (32) makes the wire (3) tightly fitted in the fitting concave portion (20), causing the inner surface (22) of the fitting concave portion (20) to be in tight contact with the outer peripheral surface of the wire (3). This can reduce the influence of the clip portion (12) mounted to the wire (3) on the electrical characteristics between the electrode (28) and the wire (3). This helps improve the accuracy of detection of the voltage applied to the wire (3).

In the voltage detection probe (10) of the first embodiment, the spring member (30) serves also as a shield. The spring member (30) attenuates noise, such as electromagnetic waves, transferred from the outside of the clip portion (12) to the electrode (28). This can reduce the occurrence of electrostatic induction or electromagnetic induction in association with the electrode (44) in the voltage detection probe (10). This helps improve the accuracy of detection of the voltage applied to the wire (3).

In the voltage detection probe (10) of the first embodiment, the electrode (28) has the protruding piece (58) folded from the inner side to the outer side of the spring member (30), and the electrode (28) is connected to the signal wire (16) through the protruding piece (58) on the outer side of the spring member (30). This makes it easier to connect the signal wire (16) and the electrode (28) in manufacturing the voltage detection probe (10).

In the voltage detection probe (10) of the first embodiment, the spring member (30) is made of phosphor bronze. The clip portion (12) is elastically deformed every time the clip portion (12) is attached to or detached from the wire (3). Phosphor bronze has excellent spring characteristics and relatively high strength, and is thus suitable as the material of the spring member (30) for use in the clip portion (12).

In the voltage detection probe (10) of the first embodiment, the outer surface of the spring member (30) is coated with the insulating coating (46). Thus, even if the clip portion (12) is in contact with an external current-carrying part, the current-carrying part and the spring member (30) are electrically insulated from each other. This can prevent the spring member (30) from being short-circuited to the external current-carrying part. The inner surface (22) of the fitting concave portion (20) is coated with the insulating coating (46). Thus, even if foreign matter, such as dust, or moisture resulting from condensation or any other factors is deposited on the inner surface of the fitting concave portion (20), the influence of the foreign matter or the moisture on the voltage detection accuracy of the voltage detection probe (10) can be reduced.

In the voltage detection probe (10) of the first embodiment, in fitting the wire (3) into the fitting concave portion (20), the pair of guide pieces (26) guide the wire (3) to the opening (24) of the fitting concave portion (20). The guiding surfaces of the guide pieces (26) have a relatively low coefficient of friction. Thus, the wire (3) can be smoothly guided to the opening (24) of the fitting concave portion (20) while being slid on the surfaces of the guide pieces (26). In contrast, the inner surface (22) of the fitting concave portion (20) has a relatively high coefficient of friction. Thus, the inner surface (22) of the fitting concave portion (20) has more grip due to the elastic force of the clip portion (12), thereby making it possible to retain the wire (3) suitably.

Variations of First Embodiment

Figure 7:
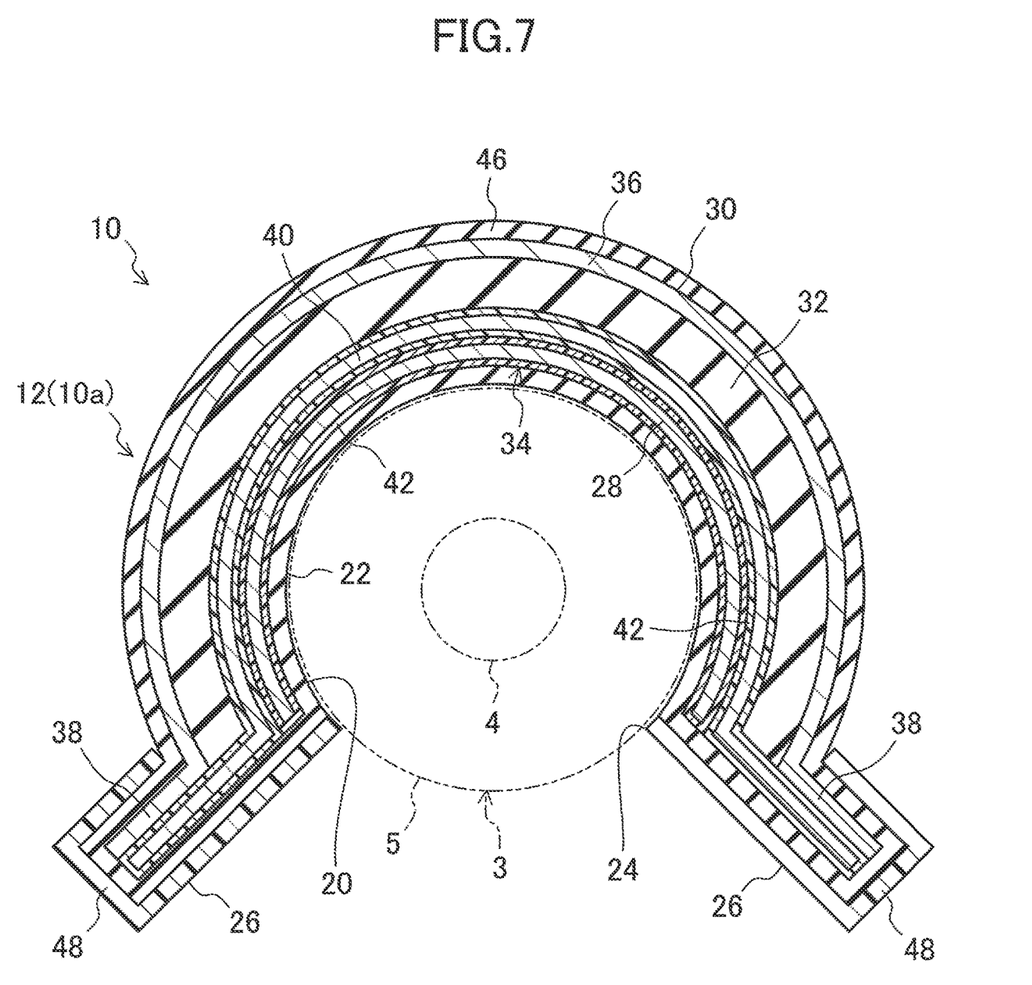
FIG. 7 is a cross-sectional view illustrating a voltage detection probe according to a first variation of the first embodiment.
Figure 8:
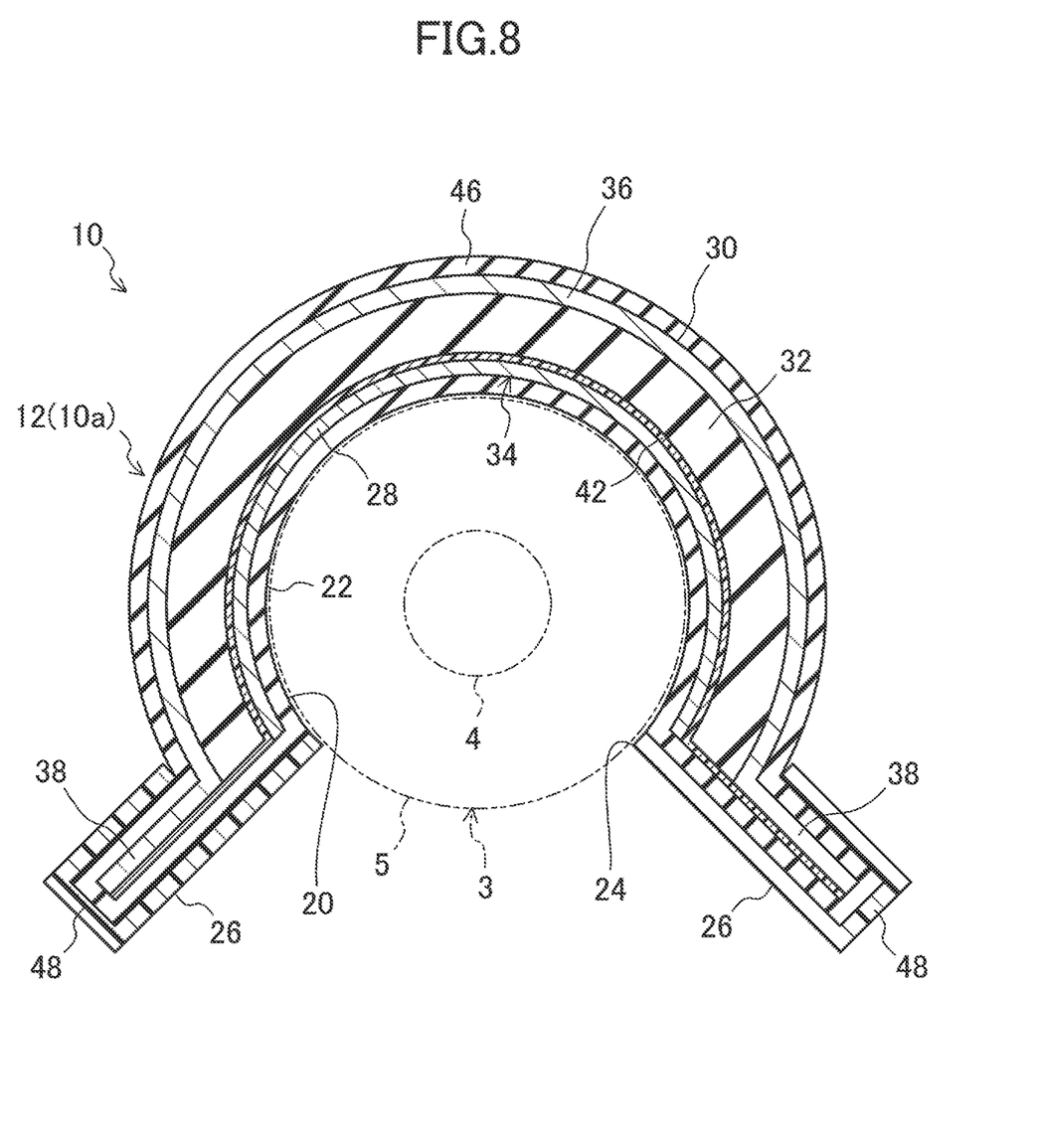
FIG. 8 is a cross-sectional view illustrating a voltage detection probe according to a second variation of the first embodiment.

As illustrated in FIG. 7, in the voltage detection probe (10), each of the shield body (40) and the electrode (28) of the sensor sheet (34) may be coated with the insulating film (42). If the spring member (30) of the voltage detection probe (10) functions as a shield, the sensor sheet (34) does not have to include the shield body (40) as illustrated in FIG. 8.

Second Embodiment

A second embodiment will be described. In the second embodiment, a voltage detection probe according to the technique of the present disclosure will be described.

Figure 9:
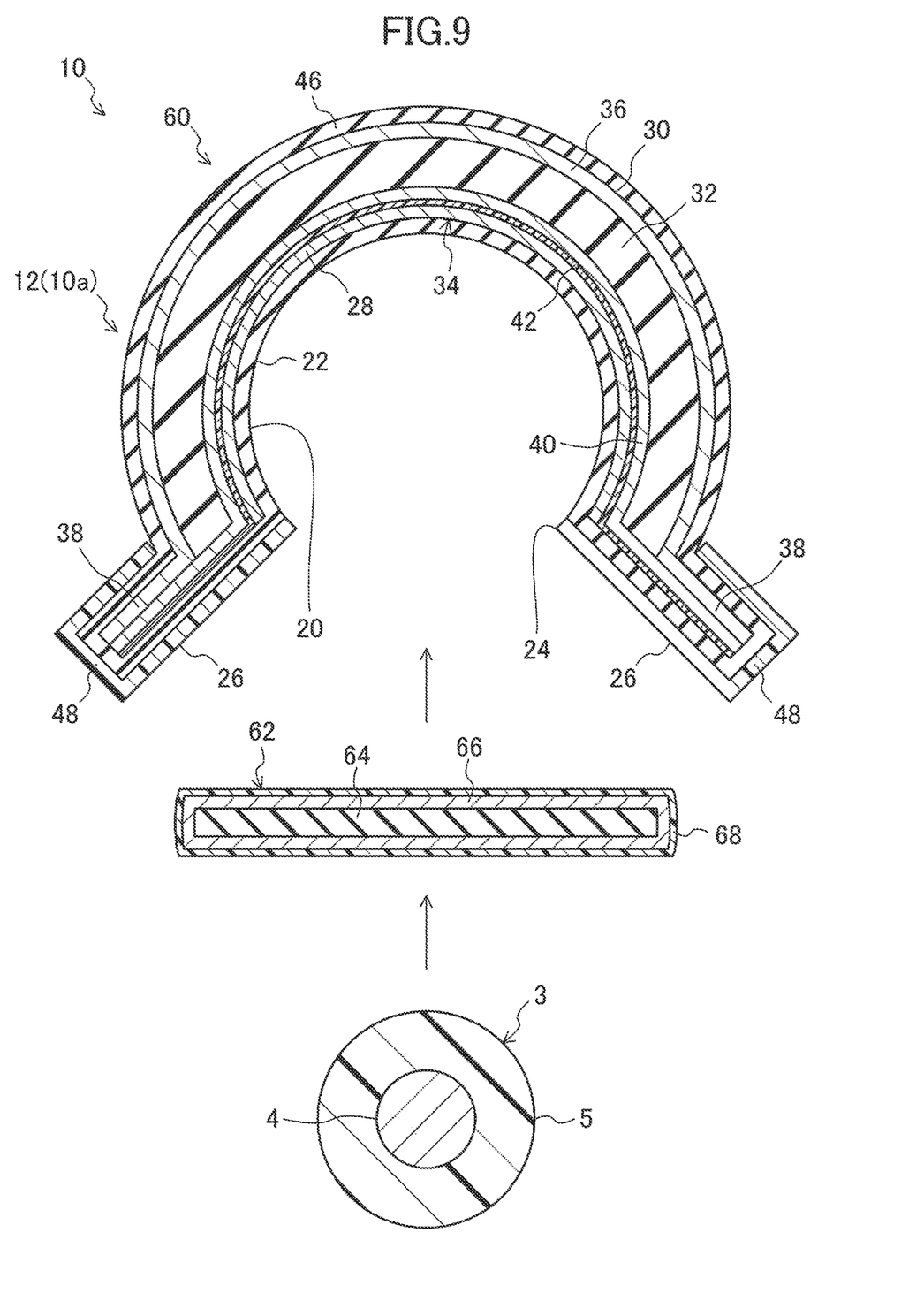
FIG. 9 is a cross-sectional view exemplifying a configuration of a voltage detection probe according to a second embodiment.

As illustrated in FIG. 9, the voltage detection probe (10) further includes an attachment (62) having cushioning properties in addition to a probe body (60) having the same configuration as the voltage detection probe (10) of the first embodiment.

Figure 10:
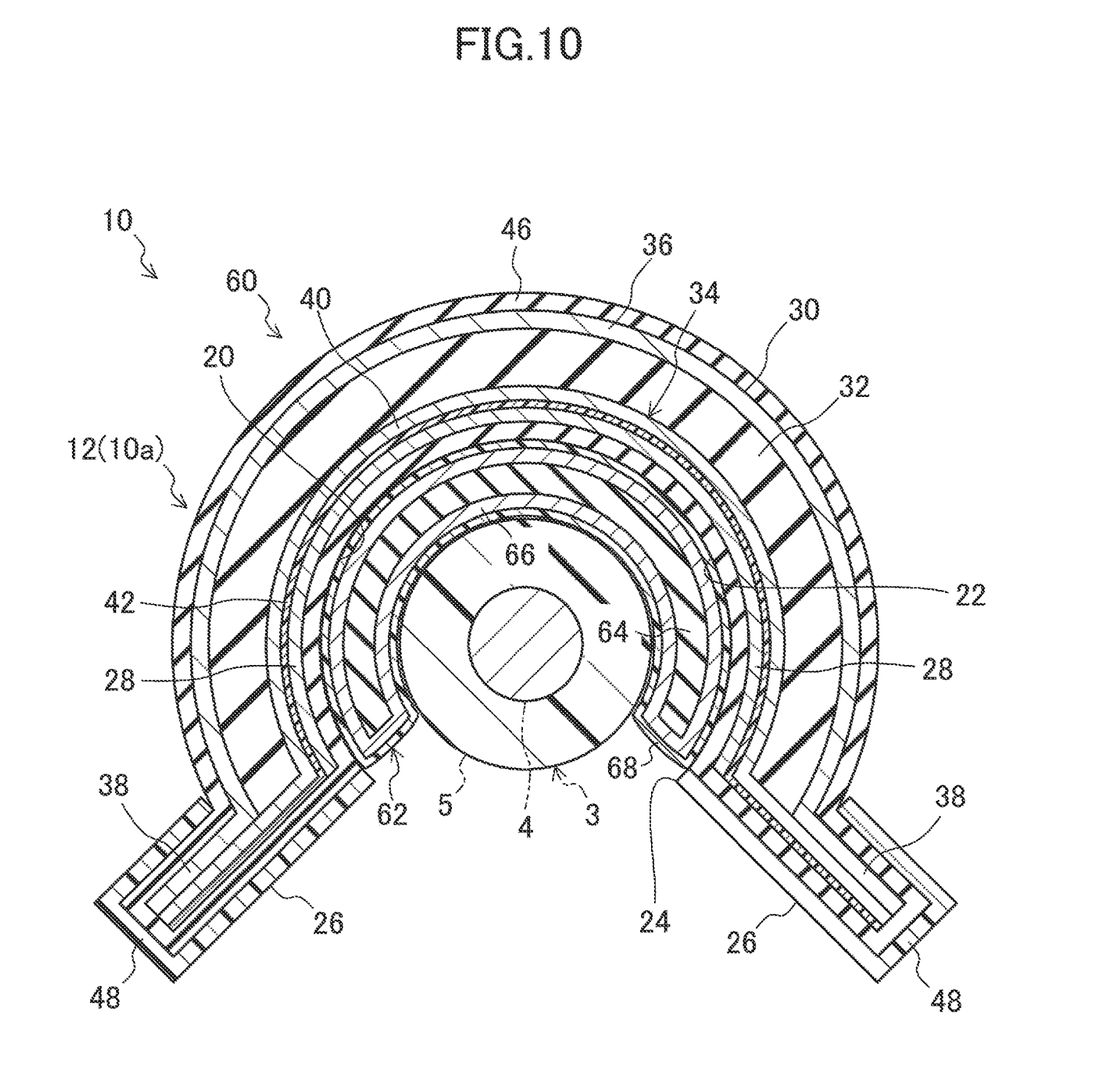
FIG. 10 is a cross-sectional view exemplifying a state where the voltage detection probe according to the second embodiment has been attached to a wire.

The attachment (62) is used by being sandwiched between the inner surface (22) of the fitting concave portion (20) of the probe body (60) and the wire (3) (see FIG. 10). The attachment (62) is disposed along the inner surface (22) of the fitting concave portion (20) in the shape of an arc during its use. The attachment (62) includes a cushion material (64), a film-like conductor (66) coating the cushion material (64), and an insulating coating (68) provided on the outer surface of the conductor (66).

The cushion material (64) is a member having both flexibility and elasticity. The cushion material (64) is made of a resin with electrical insulating properties. Examples of the material of the cushion material (64) include a fluororesin or a silicon resin.

The conductor (66) covers the cushion material (64) entirely. The conductor (66) is made of a conductive metal material. The conductor (66) is configured as, for example, a copper tape. The insulating coating (68) covers the entire outer surface of the conductor (66). The insulating coating (68) is made of a resin with electrical insulating properties.

If the internal space of the fitting concave portion (20) of the probe body (60) matches the outer diameter of the target wire (3), the attachment (62) is not used, and the voltage detection probe (10) is attached to the wire (3) by fitting the clip portion (12) to the wire (3). As illustrated in FIG. 10, if the internal space of the fitting concave portion (20) of the probe body (60) is much larger than the outer diameter of the target wire (3), the voltage detection probe (10) is attached to the wire (3) by mounting the clip portion (12) to the wire (3) with the attachment (62) sandwiched between the inner surface (22) of the fitting concave portion (20) of the probe body (60) and the wire (3).

Features of Second Embodiment

The voltage detection probe (10) of the second embodiment includes the attachment (62) having cushioning properties. The attachment (62) is used by being sandwiched between the inner surface (22) of the fitting concave portion (20) and the wire (3). Thus, the wire (3) having a smaller size than the internal space of the fitting concave portion (20) can be suitably retained by the clip portion (12). This makes the voltage detection probe (10) available for wires (3) with different sizes and helps make the probe (10) more versatile.

Third Embodiment

A third embodiment will be described. In the third embodiment, an electrode mounting tool according to the technique of the present disclosure will be described.

Figure 11:
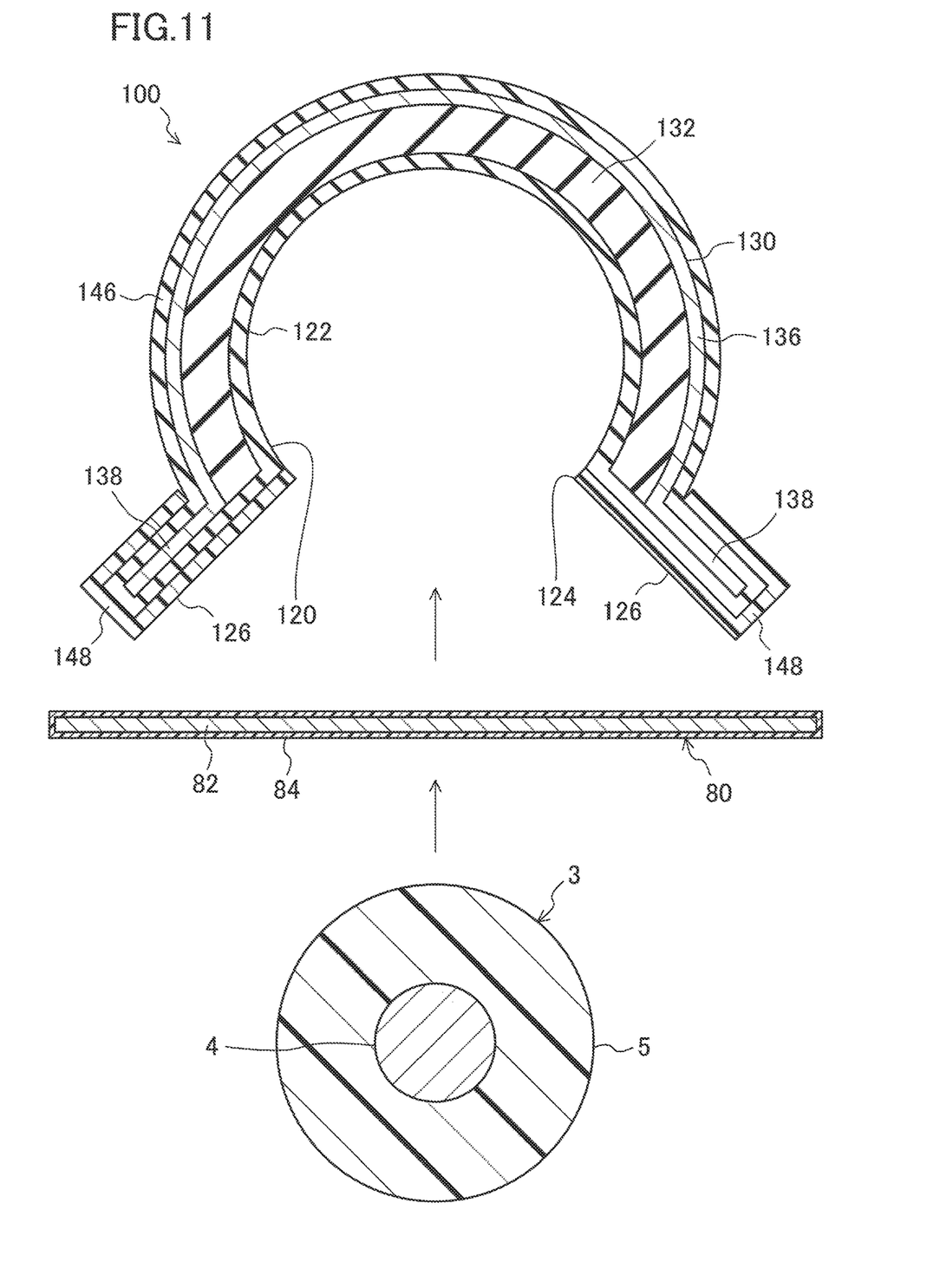
FIG. 11 is a cross-sectional view exemplifying a configuration of an electrode mounting tool according to a third embodiment.

An electrode mounting tool (100) of the third embodiment is used as a voltage detection probe (10). The voltage detection probe (10) constitutes the above-described power measuring device (1). As illustrated in FIG. 11, the voltage detection probe (10) of this example includes a flexible sensor sheet (80) and the electrode mounting tool (100) configured to fix the sensor sheet (80) to a wire (3).

The sensor sheet (80) includes an electrode (82) for detecting the voltage applied to the wire (3) (strictly, a core wire (4)), and an insulating coating (84) coating the electrode (82). The electrode (82) is made of a conductive metal material, as exemplified in the first embodiment. Although not shown, the sensor sheet (80) is connected to a measuring instrument (7) via a signal cable (10b) including a signal wire (16) connected to the electrode (82). The insulating coating (84) is made of a resin with electrical insulating properties, as exemplified in the first embodiment.

The electrode mounting tool (100) has a fitting concave portion (120) into which the wire (3) is fitted. The electrode mounting tool (100) is elastically deformable to widen the opening (124) of the fitting concave portion (120). Specifically, the electrode mounting tool (100) includes a spring member (130) having an arc shape and a cushion material (132) provided on the inner side of the spring member (130). The spring member (130) and the cushion material (132) have configurations similar to those of the spring member (30) and the cushion material (32) of the first embodiment. The spring member (130) includes a curved portion (136) and a pair of extension pieces (138). An assembly consisting of the spring member (130) and the cushion material (132) is coated with an insulating coating (146).

The insulating coating (146) is made of a material having electrical insulating properties, as exemplified in the first embodiment. The insulating coating (146) coats the outer surface of the spring member (130). The insulating coating (146) further coats the inner surface of the cushion material (132) and constitutes the inner surface (122) of the fitting concave portion (120). The extension pieces (138) of the spring member (130) are coated with the insulating coating (146) to form the guide pieces (126).

Each of the guide pieces (126) is provided with a low friction sheet (148) covering the insulating coating (146) covering the extension piece (138) of the spring member (130). The low friction sheet (148) is made of a material having a coefficient of friction that is lower than that of the insulating coating (146), as exemplified in the first embodiment. The provision of the low friction sheet (148) makes the coefficient of friction of the surface of the guide piece (126) facing the opening (124) lower than the coefficient of friction of the inner surface (122) of the fitting concave portion (120) made of the insulating coating (146).

The electrode mounting tool (100) with the above configuration is attached to the wire (3) by fitting the sensor sheet (80) along the outer peripheral surface of the wire (3) and pressing the opening (124) to the portion of the wire (3) where the sensor sheet (80) has been attached. At this moment, the guide pieces (126) allow the wire (3) to slide on the low friction sheet (148) and to be guided to the opening (124). Then, the electrode mounting tool (100) is deformed by the pressing force against the wire (3), which widens the opening (124) of the fitting concave portion (120) and allows the wire (3) to be fitted into the fitting concave portion (120). The electrode mounting tool (100) may be attached to the wire (3) by pressing the opening (124) to the wire (3) with the sensor sheet (80) curved along the inner surface (122) of the fitting concave portion (120) and placed in the fitting concave portion (120).

Figure 12:
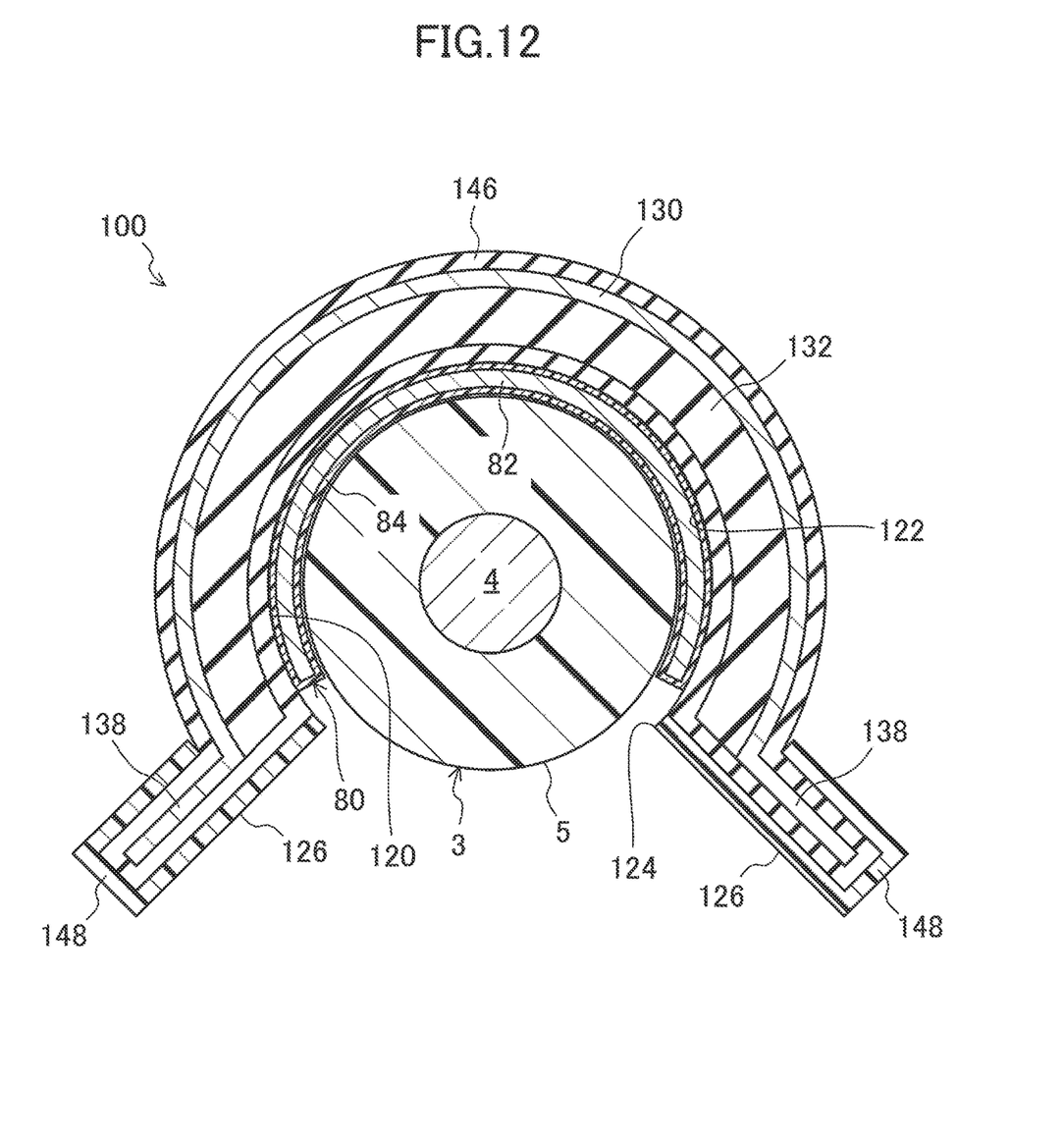
FIG. 12 is a cross-sectional view exemplifying a state where a sensor sheet has been fixed to a wire using the electrode mounting tool according to the third embodiment.

Once the wire (3) is fitted into the fitting concave portion (120), the electrode mounting tool (100) is elastically recovered, and the opening (124) of the fitting concave portion (120) becomes narrow. Accordingly, as illustrated in FIG. 12, the electrode mounting tool (100) retains, by an elastic force, the wire (3) fitted into the fitting concave portion (120), thereby sandwiching the sensor sheet (80) between the electrode mounting tool (100) and the wire (3) and causing the electrode (82) to be placed along the outer peripheral surface of the wire (3) (insulator (5)). When the pair of guide pieces (126) are pulled in directions away from each other, the electrode mounting tool (100) is deformed, and the opening (124) of the fitting concave portion (120) widens. The sensor sheet (80) is detachable when the wire (3) is detached from the fitting concave portion (120) during such a deformation of the electrode mounting tool (100).

Features of Third Embodiment

The electrode mounting tool (100) of the third embodiment is elastically deformable to widen the opening (124) of the fitting concave portion (120). The wire (3) is fitted into the fitting concave portion (120) of the electrode mounting tool (100) through the widened opening (124). The electrode mounting tool (100) retains, by an elastic force, the wire (3) fitted into the fitting concave portion (120), thereby sandwiching the sensor sheet (80) including the electrode (82) between the inner surface (122) of the fitting concave portion (120) and the wire (3). Thus, the electrode mounting tool (100) can fix the electrode (82) to the wire (3) easily in a compact configuration.

Other Embodiments

In the voltage detection probe (10) of each of the first and second embodiments, the spring member (30) may be made of resin. Preferably in this case, to improve the accuracy of detection of the voltage, the sensor sheet (34) includes the shield body (40) as in the first embodiment, or the voltage detection probe (10) (the probe body (60)) includes a shield body separate from the sensor sheet (34). The same statement applies to the electrode mounting tool (100) of the third embodiment.

In the voltage detection probe (10) of each of the first and second embodiments, the curved portion (36) of the spring member (30) may have the shape of an arc with an arc length equal to or shorter than a corresponding semicircle. In this case, the spring member (30) may include a pair of narrowing pieces that extend from both lateral ends of the curved portion (36) toward the front side of the opening (24) of the fitting concave portion (20) so as to approach each other. The clip portion (12) of the voltage detection probe (10) has a shape following such a spring member (30). The clip portion (12) may be configured such that once the wire (3) is fitted into the fitting concave portion (20), the wire (3) is retained by portions corresponding to the pair of narrowing pieces due to an elastic force of the spring member (30) so as not to come out from the opening (24).

In the voltage detection probe (10) of the second embodiment, the attachment (62) may include only the cushion material (64) without including the conductor (66) and the insulating coating (68).

While the embodiments and variations thereof have been described above, it will be understood that various changes in form and details may be made without departing from the spirit and scope of the claims. The foregoing embodiments and variations thereof may be combined and replaced with each other without deteriorating the intended functions of the present disclosure.

As can be seen from the foregoing description, the present disclosure is useful for a voltage detection probe and an electrode mounting tool.

The invention claimed is:
1. A voltage detection probe comprising:
an electrode configured to detect a voltage applied to a wire; and
a clip portion freely attachable to and detachable from the wire,
the clip portion having a fitting concave portion into which the wire is to be fitted, the clip portion being elastically deformable to widen an opening of the fitting concave portion,
the clip portion being configured to retain, by an elastic force, the wire fitted through the opening into the fitting concave portion to cause the electrode to be disposed along an outer peripheral surface of the wire,
the clip portion being provided with a pair of guide pieces that extend obliquely outward, toward a front side of the opening and away from each other, from a pair of peripheral edges of an opening of the fitting concave portion opposed to each other, and
a coefficient of friction of a surface of at least one of the guide pieces facing the opening being less than a coefficient of friction of an inner surface of the fitting concave portion.
2. The voltage detection probe of claim 1, wherein
the fitting concave portion has an inner surface having a shape of an arc with an arc length greater than a corresponding semicircle.
3. The voltage detection probe of claim 2, wherein
the clip portion includes
an arc-shaped spring member with the electrode disposed on an inner side of the arc-shaped spring member, and
a cushion material provided on the inner side of the arc-shaped spring member and between the arc-shaped spring member and the electrode.
4. The voltage detection probe of claim 2, wherein
the clip portion includes an arc-shaped spring member with the electrode disposed on an inner side of the arc-shaped spring member, an outer surface of the arc-shaped spring member is coated with an insulating coating made of a material with insulating properties, and the insulating coating forms an inner surface of the fitting concave portion.

5. The voltage detection probe of claim 1, wherein the clip portion includes an arc-shaped spring member with the electrode disposed on an inner side of the arc-shaped spring member, and a cushion material provided on the inner side of the arc-shaped spring member and between the arc-shaped spring member and the electrode.

6. The voltage detection probe of claim 5, wherein the arc-shaped spring member functions as a shield.

7. The voltage detection probe of claim 5, wherein the arc-shaped spring member is made of phosphor bronze.

8. The voltage detection probe of claim 5, wherein the clip portion includes an arc-shaped spring member with the electrode disposed on an inner side of the arc-shaped spring member, the electrode includes a protruding piece folded toward an outer side of the arc-shaped spring member across an end of the arc-shaped spring member, and a distributing wire connected to the protruding piece is disposed on the outer side of the arc-shaped spring member.

9. The voltage detection probe of claim 5, wherein the clip portion includes an arc-shaped spring member with the electrode disposed on an inner side of the arc-shaped spring member, an outer surface of the arc-shaped spring member is coated with an insulating coating made of a material with insulating properties, and the insulating coating forms an inner surface of the fitting concave portion (20).

10. The voltage detection probe of claim 1, wherein the clip portion includes an arc-shaped spring member with the electrode disposed on an inner side of the arc-shaped spring member, the electrode includes a protruding piece folded toward an outer side of the arc-shaped spring member across an end of the arc-shaped spring member, and a distributing wire connected to the protruding piece is disposed on the outer side of the arc-shaped spring member.

11. The voltage detection probe of claim 10, wherein the clip portion includes an arc-shaped spring member with the electrode disposed on an inner side of the arc-shaped spring member, an outer surface of the arc-shaped spring member is coated with an insulating coating made of a material with insulating properties, and the insulating coating forms an inner surface of the fitting concave portion.

12. The voltage detection probe of claim 1, wherein the clip portion includes an arc-shaped spring member with the electrode disposed on an inner side of the arc-shaped spring member, an outer surface of the arc-shaped spring member is coated with an insulating coating made of a material with insulating properties, and the insulating coating forms an inner surface of the fitting concave portion.

13. The voltage detection probe of claim 1 further comprising:

an attachment configured to be sandwiched between an inner surface of the fitting concave portion and the wire, the attachment having cushioning properties.

14. A voltage detection probe comprising:

an electrode configured to detect a voltage applied to a wire; and a clip portion freely attachable to and detachable from the wire, the clip portion having a fitting concave portion into which the wire is to be fitted, the clip portion being elastically deformable to widen an opening of the fitting concave portion, the clip portion being configured to retain, by an elastic force, the wire fitted through the opening into the fitting concave portion to cause the electrode to be disposed along an outer peripheral surface of the wire, the fitting concave portion having an inner surface having a shape of an arc with an arc length greater than a corresponding semicircle, the clip portion including an arc-shaped spring member with the electrode disposed on an inner side of the arc-shaped spring member, the electrode including a protruding piece folded toward an outer side of the arc-shaped spring member across an end of the arc-shaped spring member, and a distributing wire connected to the protruding piece being disposed on the outer side of the arc-shaped spring member.

15. An electrode mounting tool freely attachable to and detachable from a wire, the electrode mounting tool being configured to retain an electrode that is configured to detect a voltage applied to the wire, with the electrode being disposed along an outer peripheral surface of the wire, the electrode mounting tool comprising:

a fitting concave portion configured to have the wire fitted therein; and a pair of guide pieces, the electrode mounting tool being elastically deformable to widen an opening of the fitting concave portion, the electrode mounting tool being configured to retain, by an elastic force, the wire fitted through the opening into the fitting concave portion to sandwich the electrode between an inner surface of the fitting concave portion and the wire, the pair of guide pieces extending obliquely outward, toward a front side of the opening and away from each other, from a pair of peripheral edges of an opening of the fitting concave portion opposed to each other, and a coefficient of friction of a surface of at least one of the guide pieces facing the opening being less than a coefficient of friction of an inner surface of the fitting concave portion.

* * * * *